US009939725B2

(12) United States Patent
Boegli et al.

(10) Patent No.: US 9,939,725 B2
(45) Date of Patent: Apr. 10, 2018

(54) METHOD AND DEVICE FOR PRODUCING MASKS FOR A LASER INSTALLATION

(75) Inventors: Charles Boegli, Marin (CH); Steffen Weissmantel, Chemnitz (DE); Günter Reisse, Chemnitz (DE); Andy Engel, Colditz (DE); Rene Boettcher, Mittweida (DE); Werner Steffen, Stansstad (CH)

(73) Assignee: Boegli-Gravures S.A., Marin (CH)

( * ) Notice: Subject to any disclaimer, the term of this patent is extended or adjusted under 35 U.S.C. 154(b) by 208 days.

(21) Appl. No.: 13/513,925

(22) PCT Filed: Nov. 22, 2010

(86) PCT No.: PCT/CH2010/000295
§ 371 (c)(1),
(2), (4) Date: Jun. 5, 2012

(87) PCT Pub. No.: WO2011/072409
PCT Pub. Date: Jun. 23, 2011

(65) Prior Publication Data
US 2012/0237731 A1 Sep. 20, 2012

(30) Foreign Application Priority Data
Dec. 18, 2009 (EP) ................................. 09405228

(51) Int. Cl.
*G02B 5/18* (2006.01)
*G03F 1/54* (2012.01)
(Continued)

(52) U.S. Cl.
CPC ............ *G03F 1/54* (2013.01); *B23K 26/0006* (2013.01); *B23K 26/0078* (2013.01);
(Continued)

(58) Field of Classification Search
CPC ... G02B 27/4233; G02B 27/44; G03F 7/0017; B23K 26/36; B23K 26/0656;
(Continued)

(56) References Cited

U.S. PATENT DOCUMENTS 4,916,322 A * 4/1990 Glavish et al. ............ 250/492.2
5,032,003 A 7/1991 Antes
(Continued)

FOREIGN PATENT DOCUMENTS

EP 0375833 A1 7/1990
EP 1437213 A1 7/2004
(Continued)

OTHER PUBLICATIONS

M. Richardson, A. Zoubir, C. Rivero, C.Lopez, L. Petit & K Richardson. Femtosecond laser micro-structuring and refractive index modification applied to laser and photonic devices. Micromachining Technology for Micro-Optics and Nano-Optics II, edited by Eric G. Johnson, Gregory P. Nordin, Proceedings of SPIE vol. 5347 (SPIE, Bellingham, WA, 2004).*
(Continued)

*Primary Examiner* — Bumsuk Won
*Assistant Examiner* — Collin X Beatty
(74) *Attorney, Agent, or Firm* — Foley & Lardner LLP

(57) ABSTRACT

In the method for producing masks and/or diaphragms for a laser installation for the creation of microstructures on a solid body surface according to the mask projection technique, predetermined opaque surface portions which scatter the laser radiation are produced in the mask and/or diaphragm substrate by roughening and modifying the latter by means of a femtosecond, picosecond or fluor laser beam. Such masks and diaphragms have a strongly improved lifetime and accuracy and may e.g. serve for the creation of blazed gratings which, arranged in diffraction grating arrays
(Continued)

on a solid body surface, serve for producing spectral colors and mixed colors of high brilliance.

36 Claims, 4 Drawing Sheets

(51) Int. Cl.
  *B23K 26/00* (2014.01)
  *B82Y 10/00* (2011.01)
  *B82Y 40/00* (2011.01)
  *B23K 26/0622* (2014.01)
  *B23K 26/066* (2014.01)
  *G03F 1/00* (2012.01)
  *G03F 7/00* (2006.01)
  *B23K 103/00* (2006.01)

(52) U.S. Cl.
  CPC ........ *B23K 26/066* (2015.10); *B23K 26/0624* (2015.10); *B82Y 10/00* (2013.01); *B82Y 40/00* (2013.01); *G03F 1/00* (2013.01); *B23K 2203/50* (2015.10); *G03F 7/0002* (2013.01); *Y10T 428/24479* (2015.01)

(58) Field of Classification Search
  CPC .. B23K 26/381; B23K 26/4075; B23K 26/40; B23K 26/364; H01L 21/78; H01L 21/3065; H01L 21/67207
  USPC ........ 359/558, 563, 566–576, 589; 219/121.68; 264/154, 400, 405; 216/24, 216/94
  See application file for complete search history.

(56) References Cited

U.S. PATENT DOCUMENTS

| | | | |
|---|---|---|---|
| 5,091,979 A * | 2/1992 | White | 385/1 |
| 5,523,543 A * | 6/1996 | Hunter, Jr. | G01J 1/4257 |
| | | | 219/121.62 |
| 5,573,875 A | 11/1996 | Kaplan et al. | |
| 6,303,900 B1 * | 10/2001 | Tachikawa | B41J 2/162 |
| | | | 219/121.7 |
| 6,342,969 B1 * | 1/2002 | Lee | 359/569 |
| 6,621,040 B1 * | 9/2003 | Perry | A61B 18/20 |
| | | | 219/121.67 |
| 6,703,582 B2 * | 3/2004 | Smart | B23K 26/0736 |
| | | | 219/121.62 |
| 7,198,961 B2 * | 4/2007 | Li | B81C 1/00492 |
| | | | 438/7 |
| 7,595,895 B2 * | 9/2009 | Kurita | B23K 26/0057 |
| | | | 356/445 |
| 7,663,734 B2 * | 2/2010 | Ohmi et al. | 355/67 |
| 7,676,128 B1 * | 3/2010 | Mossberg et al. | 385/37 |
| 7,751,608 B2 * | 7/2010 | Hersch et al. | 382/135 |
| 8,058,086 B2 * | 11/2011 | Bach | H01L 21/3065 |
| | | | 257/618 |
| 2002/0086245 A1 * | 7/2002 | Zait et al. | 430/321 |
| 2003/0201578 A1 * | 10/2003 | Li et al. | 264/400 |
| 2004/0151796 A1 * | 8/2004 | Boegli | 425/364 R |
| 2004/0161709 A1 * | 8/2004 | Schroeder et al. | 430/321 |
| 2005/0226287 A1 * | 10/2005 | Shah | G01J 11/00 |
| | | | 372/25 |
| 2005/0280182 A1 | 12/2005 | Boegli | |
| 2006/0018021 A1 * | 1/2006 | Tomkins et al. | 359/573 |
| 2006/0086459 A1 * | 4/2006 | Koga et al. | 156/345.19 |
| 2007/0263974 A1 * | 11/2007 | Khrushchev et al. | 385/141 |
| 2007/0282030 A1 * | 12/2007 | Anderson et al. | 522/1 |
| 2008/0076267 A1 * | 3/2008 | Oishi et al. | 438/785 |
| 2008/0193085 A1 * | 8/2008 | Singh et al. | 385/37 |
| 2009/0050001 A1 * | 2/2009 | Boegli | 101/6 |
| 2009/0214885 A1 * | 8/2009 | Her et al. | 428/544 |
| 2010/0089881 A1 * | 4/2010 | Bruland et al. | 219/121.68 |
| 2010/0159369 A1 * | 6/2010 | Hiroshima | 430/5 |
| 2011/0194805 A1 * | 8/2011 | Wang | G02B 6/02152 |
| | | | 385/12 |

FOREIGN PATENT DOCUMENTS

| | | |
|---|---|---|
| JP | 10-101379 A | 4/1998 |
| JP | 10-113780 A | 5/1998 |
| JP | 2001-062574 A | 3/2001 |
| JP | 2001-305367 A | 10/2001 |
| JP | 2002-011589 A | 1/2002 |
| JP | 2004-306134 A | 11/2004 |
| JP | 2006-007776 A | 1/2006 |
| JP | 2007-526129 A | 9/2007 |
| JP | 2008-225322 A | 9/2008 |
| JP | 2008-229701 A | 10/2008 |
| JP | 2009-102195 A | 5/2009 |
| WO | WO-94/28444 A | 12/1994 |
| WO | WO 94/28444 A1 | 12/1994 |
| WO | WO-2005/092559 | 10/2005 |
| WO | WO 2007/012215 A1 | 2/2007 |
| WO | WO-2010/111799 A1 | 10/2010 |

OTHER PUBLICATIONS

K. Venkatakrishnan, BKA Ngoi, P Stanley, Len Lim, B Tan, NR Sivakumar. Laser writing techniques for photomask fabrication using a femtosecond laser. Appl. Phys. A 74, 493-496 (2002) / Digital Object Identifier (DOI) 10.1007/s003390101030.*
Mordechai Rothschild. Projection optical lithography. Materials Today vol. 8, Issue 2, Feb. 2005, pp. 18-24.*
International Search Report for PCT/CH2010/000295; dated Jan. 14, 2011; 6 pages.
Reif J. et al., "Self-organized regular surface patterning by pulsed laser ablation", Physica Status Solidi, vol. C6, No. 3, (Jan. 14, 2009), pp. 681-686.
European Office Action; EP No. 10785320.2; dated Apr. 10, 2013; 6 pages.
Office Action issued in Japanese Patent Appln. No. 2012-543432 with English translation; dated Sep. 19, 2014; 9 pages.
Office Action dated Jul. 28, 2015 in related Japanese Appl. 2012-543432 with English-language translation (7 pgs.).

\* cited by examiner

METHOD AND DEVICE FOR PRODUCING MASKS FOR A LASER INSTALLATION

CROSS-REFERENCE TO RELATED APPLICATIONS

This application is the National Phase of PCT/CH2010/000295, filed Nov. 22, 2010, which claims priority to European Application No. 09405228.9, filed Dec. 18, 2009. The contents of the foregoing applications are incorporated by reference in their entirety.

FIELD OF INVENTION

The present invention relates to a method for producing masks and/or diaphragms for a laser installation for the creation of microstructures on a solid body surface in which the areas of the masks and/or diaphragms that are opaque to the laser radiation scatter the incident laser radiation. For the sake of simplicity, only masks will be mentioned hereinafter, but this term also comprise diaphragms here.

BACKGROUND OF THE INVENTION

In certain laser installations, microstructures are created according to the mask projection technique, as e.g. disclosed in WO 2007/012215 to the applicant of the present invention. The laser may e.g. be a KrF excimer laser having a wavelength of 248 nanometers (nm). The mask projection technique implemented with such laser installations requires a mask and diaphragm combination that may be arranged in a changer device.

A mask serves for shaping a predetermined intensity profile of the laser beam and thus to transmit the laser beam in certain portions of the mask surface only. Consequently, when irradiated with a high-energy laser, it is subject to high stresses that may lead to deformations and to high wear. To prevent that laser radiation may pass through the non-transmitting areas of the mask surface, there are the following possibilities: Absorption, reflection, or scattering.

For the first possibility, a lacquer coat may be applied in these areas, but it will not withstand the stress for long. The same applies to optical lithography. For the second possibility, e.g. a dielectric mirror may be deposited in the desired locations. However, this technique is very demanding.

For producing scattering areas, etching techniques are known in the art today, but these are far too inaccurate. The above-mentioned disadvantages apply especially if masks serve for creating e.g. optically effective diffraction gratings and similar microstructures. This severe drawback of a relatively coarse forming of areas with less transparency applies also to the roughening of surfaces according to JP 2002-011589 A which are produced by sandblasting.

SUMMARY OF THE INVENTION

Consequently, it is a first object of the invention to provide a method and a device for producing masks and diaphragms that are highly wear-resistant, dimensionally stable, and suitable for use in laser installations for the creation of microstructures. This object is attained by the method wherein the areas which scatter the laser radiation are roughened and modified by irradiation with a femtosecond, picosecond, or fluor laser beam.

Masks and diaphragms produced according to the method of claim 1 are particularly suitable for the creation of optically effective diffraction gratings producing spectral colours of high brilliance and, based on the latter, mixed colours of high colour intensity. Diffraction gratings of the prior art are groove and rib gratings, and based thereon, it is a second object of the invention to use masks and diaphragms having been produced according to claim 1 for creating diffraction gratings which provide a higher colour intensity and purer spectral colours upon irradiation with light. This object is attained according to claim 5.

BRIEF DESCRIPTION OF THE DRAWINGS

The invention will be explained in more detail hereinafter with reference to drawings of exemplary embodiments.

DETAILED DESCRIPTION OF THE INVENTION

Figure 1:
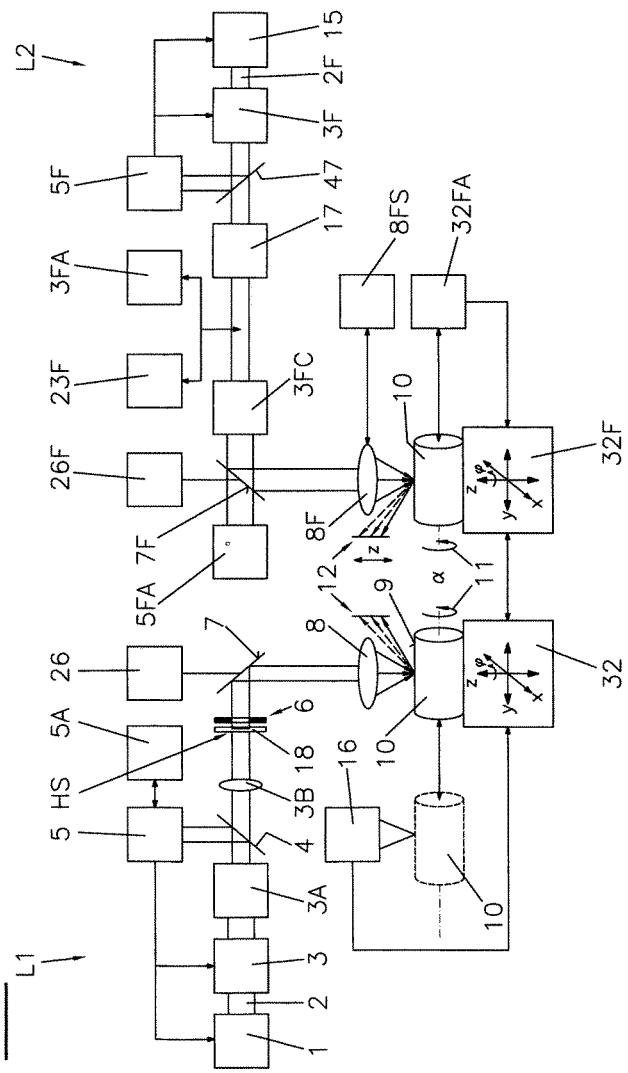
FIG. 1 shows a schematic diagram of a device according to the invention having two laser installations for creating diffraction grating arrays directly on a solid body surface.

In FIG. 1, a device for producing diffraction gratings with two laser installations is illustrated of which the one on the left in the drawing is an excimer laser installation that is suitable for producing e.g. blazed grating arrays and the laser installation on the right is a femto- or picosecond laser installation that serves for creating masks and/or diaphragms for producing the grating structures, on one hand, and on the other hand is apt either to produce directly acting ripple grating structures or to superpose the grating structures produced by the excimer laser with a second grating structure that is based on a variation of the spacing between the ripples.

The first laser installation L1, comprising a KrF excimer laser having a wavelength of 248 nanometers nm, serves to produce microstructures in the solid body surface according to the mask projection technique, and the second laser installation L2, comprising a femtosecond laser 15 having a centre wavelength of 775 nm or its frequency-doubled or -tripled wavelength, serves to produce either nanostructures, e.g. ripple grating structures, in the solid body surface, or to create masks, according to the focus technique. For the purposes of the present application, the term "solid body" is meant to include any substrate in whose surface microstructured diffraction gratings can be produced by means of a laser, e.g. glass, watchglasses from glass or sapphire, ceramics, suitable synthetic materials, and mainly metallic surfaces on jewellery or coins, and particularly also hard material coated surfaces of embossing tools such as embossing dies and embossing plates for embossing packaging foils as well as organic solid bodies. The surface may previously have been pre-treated, chemically or mechanically processed, and structured. As a hard material coating, e.g. tetrahedrally bonded amorphous carbon (ta-C), tungsten carbide (WC), boron carbide ($B_4C$), silicon carbide (SiC), or similar hard materials may be contemplated.

The microstructures may e.g. be so-called blazed gratings having grating periods of 1 to 2 µm, and the nanostructures may e.g. be self-organized ripple structures having periods of 300 nm to 1000 nm which act as optical diffraction gratings. As will be explained below, any periodic array of the diffraction-optically active structures is possible that produces an angular-dependent dispersion, i.e. a separation into spectral colors, by diffraction upon irradiation with light.

In FIG. 1, a first laser, an excimer laser 1 is shown whose beam 2 has a rectangular cross-section here. The intensity of this laser beam can be adjusted and varied by an attenuator 3. By means of homogenizer 3A and field lens 3B, a homogenous intensity distribution across the laser beam cross-section is created in homogenous spot HS. The intensity profile across the laser beam cross-section that is required for the microstructure to be produced is shaped from this homogenous intensity distribution by means of mask 18 positioned in homogenous spot HS.

The geometrical shape of the opening in diaphragm 6 arranged after the mask, and preferably in contact therewith, produces the cross-sectional geometry or contour shape of the intensity profile of the laser beam shaped by mask 18. Mask 18 and diaphragm 6 are located in a mask and diaphragm changer device.

Instead of a KrF excimer laser, an ArF excimer laser having a wavelength of 193 cm, a fluor ($F_2$) laser having a wavelength of 157 cm, or a XeCl excimer laser having a wavelength of 308 nm can be used as first laser 1.

Figure 2:
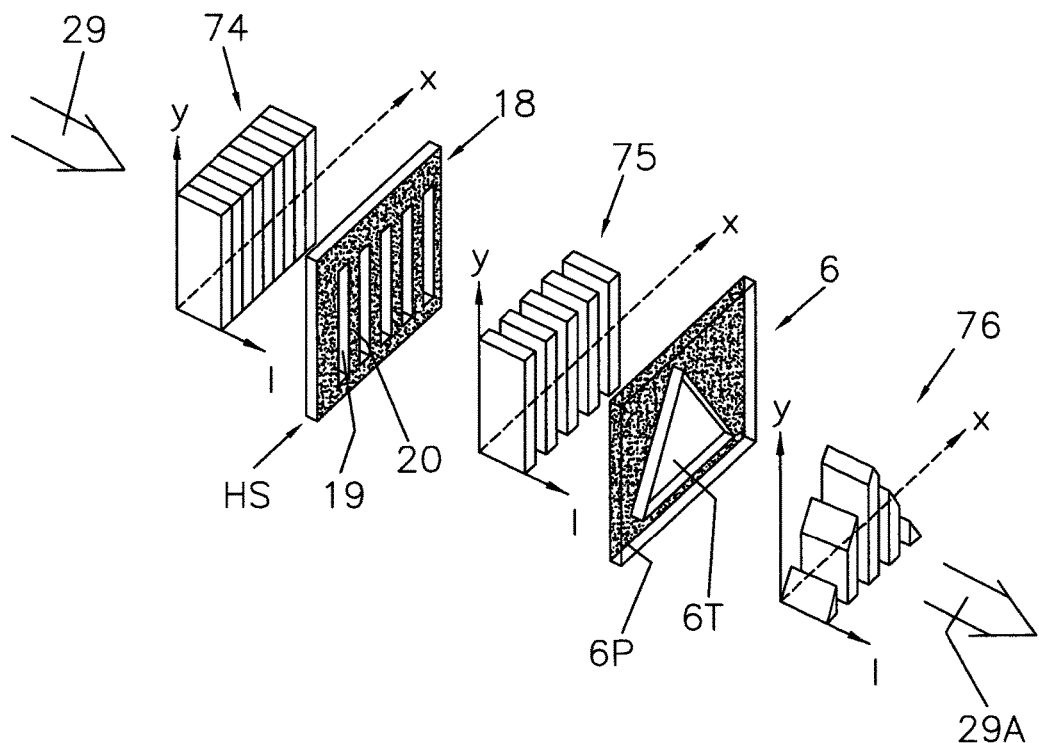
FIG. 2 shows laser beam intensity shaping by means of a mask and diaphragm combination.

Instead of a femtosecond laser, a picosecond laser of the Nd:YAG type having a wavelength of 1064 nm or its frequency-doubled wavelength of 532 nm or its frequency-tripled wavelength of 266 nm can be used as second laser The laser beam shaped by mask 18 and diaphragm 6, see also FIG. 2, impinges on a deflection mirror 7 that guides the beam through an appropriate imaging optics 8 for this laser beam which images the appropriate laser intensity profile for the microstructure onto surface 9 of the ta-C layer on embossing roller 10 at a predetermined imaging scale of e.g. 8:1. By rotation arrows 11 it is indicated that embossing roller 10 can be rotated about its longitudinal axis by predetermined angles. Embossing roller 10 is arranged on a displacing device 32.

In order to adjust, monitor, and stabilize the power and thus the intensity of the laser beam, a small fraction of the laser beam is directed by means of beam splitter 4 onto a power meter 5 that delivers data for the control of attenuator 3 and/or laser 1. This power meter 5 may selectively be exchanged for a laser beam intensity profile measuring device 5A, which is indicated by a double arrow in FIG. 1. Devices 5 and 5A are positioned at the same distance from beam splitter 4 as mask 18 located in homogenous spot HS in order to allow a correct measurement of the power and of the intensity distribution of the laser beam in homogenous spot HS, i.e. in the mask plane. A camera 26 serves for observing the microstructuring process. To this end, deflection mirror 7 has an interference layer system that reflects the excimer laser radiation of 248 nm wavelength but transmits visible light.

To adjust a precisely determined position of the imaging plane of the laser beam imaged by imaging optics 8 onto the ta-C layer to be structured over the entire surface area of embossing roller 10, the position and the production-related deviations of the embossing roller from the ideal geometry are measured by means of device 16 for the position survey of the embossing roller, e.g. by means of trigonometric measuring methods. These measuring data are then used for the automatic adjustment of embossing roller 10 by means of displacing device 32 and for the correction control of the z-axis of displacing device 32 during the structuring process.

As already briefly mentioned in the description of the exemplary embodiment according to FIG. 1, the intensity profile required for the excimer laser structuring process according to the mask projection technique is shaped by means of a mask and a diaphragm.

This process will be explained in more detail herebelow with reference to FIG. 2: From the homogenous intensity distribution 74 of laser beam 29 in homogenous spot HS, the intensity profile across the laser beam cross-section required for the microstructure to be produced in the ta-C layer on embossing roller 10 is shaped by means of mask 18 positioned in homogenous spot HS. In the present schematic view, mask 18 has transparent areas 19 arranged in a grid-like manner and surface areas 20 that are opaque to the laser beam, and thus forms a grid-like intensity profile 75 with cuboidal intensity profile portions.

Diaphragm 6, which in the direction of the laser beam is arranged after the mask and preferably in contact therewith, produces the cross-sectional geometry of the intensity profile of the laser beam shaped by mask 18 by the geometrical shape of its opening or transparent surface area. In the present illustration, the shape of diaphragm opening 6T or the surface area of the diaphragm within the opaque portion 6P that is transparent to the laser beam is in the form of a triangle, and consequently, after the diaphragm, the intensity profile 76 of laser beam 29A exhibits a triangular cross-sectional geometry.

In FIG. 2, the grating period of mask 18 and the thickness as well as the spacing of the cuboidal intensity profile portions of laser beam intensity profile 75, 76 after the mask are depicted on a strongly enlarged scale in the x coordinate direction. The grating period of the mask measures in an example at an imaging ratio of the mask projection system of 8:1, 4 to 20 µm in order to produce e.g. grating structures having grating periods of 0.5 to 5 µm in solid body surface 9, e.g. a ta-C layer on embossing roller 10, by means of laser beam 29A shaped by the mask. In reality, with equal sizes of the surface areas of homogenous spot HS and of the structured area of mask 18 of e.g. 8 mm×8 mm=64 $mm^2$, the structured mask area, in contrast to the schematic illustration of FIG. 2, consists of a stripe grating having 2000 to 400 grating periods, and the laser beam shaped therewith consists of 2000 to 400 cuboidal intensity profile portions.

The size, shape, spacing, position, and number of transparent surface areas of mask 18, hereinafter called the mask structure, determine the laser beam intensity profile for creating the microstructure having a predetermined optical effect in the ta-C layer, and diaphragm 6 determines the cross-sectional geometry of the laser beam intensity profile and thus the geometrical shape of the microstructured area element on the embossing roller. The term "area element" is used here to designate the surface on the embossing roller or embossing die that is structured by the laser beam shaped by the mask and the diaphragm and imaged onto the ta-C coated roller surface in a laser beam pulse sequence without a relative movement of the laser beam and the roller surface.

Consequently, by a variation of the mask structure, and particularly by rotating the mask about the optical axis of the laser beam by predetermined angles, the orientation of the laser beam intensity profile shaped by the mask and imaged on the ta-C layer of the embossing roller by means of focusing optics 8 can be varied and thus the optical effect of the microstructured area element upon irradiation with polychromatic light, e.g. the viewing direction and the viewing angle, as well as color and intensity.

By rotating diaphragm 6 about the optical axis of the laser beam by predetermined angles, the orientation of the cross-sectional geometry shaped by the diaphragm of the laser beam imaged on the ta-C layer on the embossing roller by means of the focusing optics is varied and thus the orientation of the laser-structured area element on the surface of the embossing roller.

The microstructured area elements may either be juxtaposed according to a particular pattern or, after rotating the mask by a predetermined angle, superposed with the same microstructure under this predetermined angle. Furthermore, if different masks are used, different microstructures can be superposed in an area element. If they are juxtaposed, the area elements may have the same or different surface shapes and microstructures.

When white light radiation, near-sunlight, is diffracted or when a diffraction grating is irradiated with polychromatic light, e.g. with daylight fluorescent lamps or light bulbs, hereinafter briefly called "light", due to the wavelength-dependent diffraction angle, the so-called diffraction angular dispersion occurs, i.e. a separation into the spectral colors whose photons have a particular wavelength, i.e. into monochromatic light. Therefore, if none of the diffraction orders overlap, only these spectral colors are observed in the diffracted light.

According to the invention, by means of diffraction grating arrays, mixed colors are created by the superposition of multiple photon wavelengths of the spectral colors which may be viewed under one or multiple predetermined viewing angles and one or multiple predetermined azimuthal viewing directions of the diffraction grating arrays. By means of diffraction grating arrays in a solid body surface having different grating periods in the microscopic subareas=color pixel areas below the resolving ability of the human eye, the mixed colors are preferably produced, upon irradiation of the diffraction grating array with light, from photons of the three different primary spectral color wavelengths red, green, and blue appearing in the diffraction spectrum, the wavelengths for the primary spectral colors being selected depending on the intended application. Thus, if the mixed color is to be viewed by the human eye, for the primary spectral color red, a wavelength λred of 630 nm, for green, a wavelength λgreen of 530 nm, and for blue, a wavelength λblue of 430 nm are e.g. advantageous.

The diffraction grating array may e.g. be composed of color pixel diffraction grating areas producing the primary colors red, green, and blue, analogously to the cone photoreceptors of the human eye which contain three different types of visual pigments that are mainly sensitive to red, green, and blue. Applicable diffraction grating types are e.g. groove and rib gratings, column grid gratings, and blazed gratings that are e.g. produced by excimer laser structuring according to the mask projection technique, or self-organized ripple gratings having predetermined, adjusted ripple grating periods that are produced by femto- or picosecond laser irradiation according to the focus technique, or by superposition of both structures.

For a predetermined angle of incidence of the light, or on diffuse irradiation, respectively, the grating period and the orientation of the diffraction grating within the color pixel area determine the diffraction directions of the spectral colors and thus the viewing angle and the azimuthal viewing direction of the primary color of the individual color pixel. In this respect, the wavelengths of the mixed color have to be chosen and the diffraction gratings of the arrays aligned such that the diffraction angle and the diffraction direction of at least one diffraction order are the same for each wavelength of the mixed color in order to achieve an effective color mixture under at least one viewing angle in at least one azimuthal viewing direction.

Hereinafter, the creation of a blazed grating structure as well as the production of a suitable mask for creating the blazed grating structure will be described with reference to FIGS. 3 to 8. In a blazed grating, the maximum of the separating function and thus the highest intensity maximum can be shifted from the maximum of the 0th diffraction order to a maximum of a higher diffraction order through a variation of the inclination of the steps, i.e. through a variation of blaze angle $\alpha_B$, since the maximum of the separating function and thus the highest intensity maximum is always located in the reflection direction relative to the step normal SN. When $\alpha_B$ varies, the diffraction angles $\alpha_m$=viewing angles of the different diffraction orders and thus the positions of the maxima of the grating diffraction remain unchanged as long as the grating period g and the angle of incidence $\alpha_e$ of the incident light are kept constant. Furthermore, in FIG. 3, s denotes the blazed grating side, h the blazed grating height, eS the incident beam, GN the grating normal, and SN the step normal.

Since nearly the entire grating surface, or more precisely the surface formed by the step width s multiplied by the grating furrow length and the number of furrows, is utilized for the diffraction, the diffraction intensities and thus the observed brilliance of the diffracted spectral colors are substantially higher in a blazed grating than on diffraction on a simple stripe grating=groove and rib grating.

Figure 3:
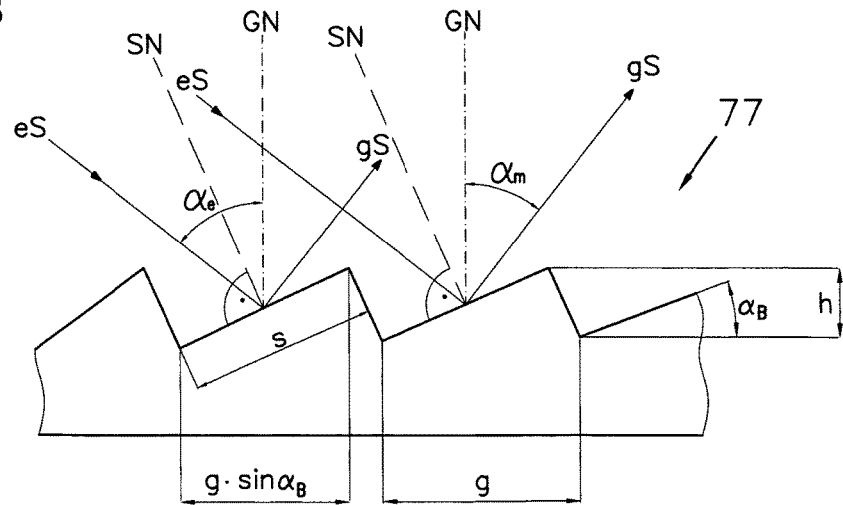
FIG. 3 shows a preferred blazed grating structure in a sectional view.
Figure 4:
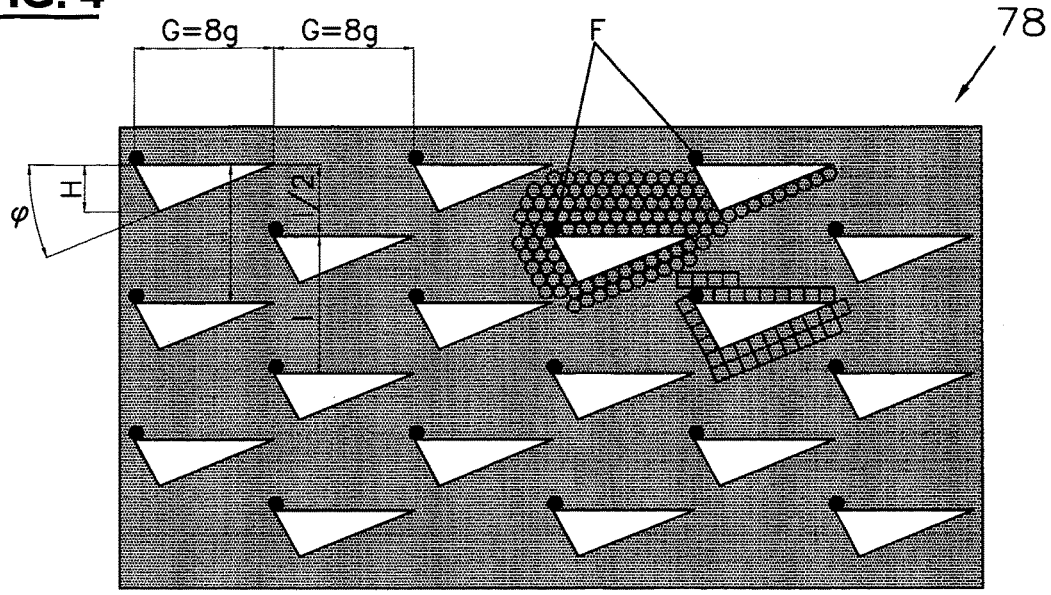
FIG. 4 shows a first mask for creating the blazed grating structure of FIG. 3.

The blazed grating structure of FIG. 3 is produced by means of mask of FIG. 4, this mask consisting of a quartz glass substrate whose opaque surface may be produced by a femtosecond laser or $F_2$ laser beam while the transmitting triangular areas which are to produce the blazed grating structure upon irradiation with the foregoing excimer laser and simultaneous scanning of the mask are spared. By the irradiation with femtosecond laser pulses or fluor laser pulses, the surface of the quartz substrate is roughened and modified so that the incident light is scattered but not absorbed. The term "modified" designates an alteration of the material density, structure, and refractive index of the substrate here. In this manner, a very low thermal load, a high dimensional accuracy, and a very long lifetime of such masks are ensured.

In the production of the mask in the quartz glass substrate by means of the femtosecond laser according to the focus technique or the $F_2$ laser according to the mask projection technique, the nontransparent area that leaves the transmitting transparent triangular areas free is produced by scanning with the smallest possible focus or imaging cross-section F and overlapping laser pulses that are represented in FIG. 4 as small grey filled circles of the fs laser or small black filled circles of the $F_2$ laser. The small squares indicate that square cross-sectional shapes of the laser beam may be used as well. In this manner, except for the transmitting triangular areas shown in white, the entire surface area shown in grey in FIG. 4 is scanned. More specifically, the surface of the scanned areas is roughened and modified with a suitable fluence of the laser beam in such a manner that these areas strongly scatter the incident laser beam portions of the excimer laser and thus act as opaque areas for the laser beam.

The quantity G is the base of the transmitting triangle and is equal to 8× grating constant g since an imaging ratio of 8:1 is used here for producing the blazed grating according to the excimer laser mask projection technique by means of this mask. Correspondingly, H is the height and φ the base angle of the transmitting triangle, and I is the distance between the transmitting triangles in the mask scanning direction. If an $F_2$ laser installation is used, a different imaging ratio of 25:1 is used.

Figure 5:
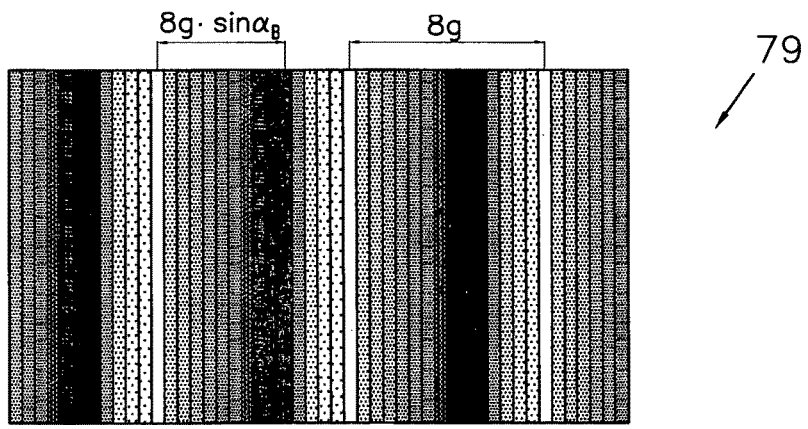
FIG. 5 shows a second mask for creating the blazed grating structure of FIG. 3.
Figure 6:
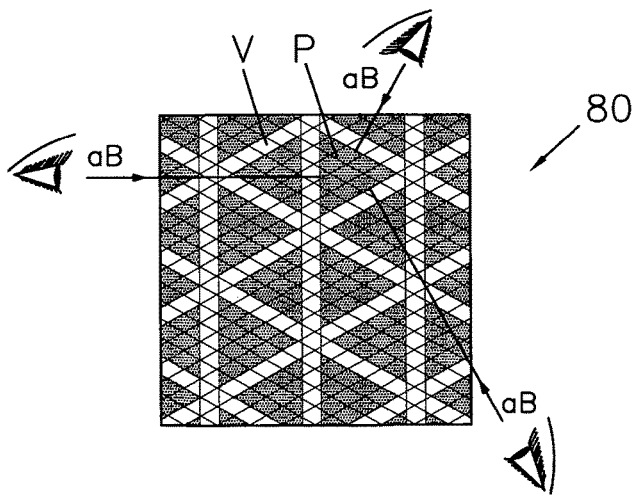
FIG. 6 shows another diffraction grating in the form of a column or blind hole grating having triangular column or pit cross-sections.

Blazed grating structures may alternatively be produced by means of stripe masks 79 according to FIG. 5, the stripe mask having two different stripe widths as required for producing a blazed grating furrow, whose transmittance varies between 0 and 1 and between 1 and 0 over the respective stripe width according to predetermined linear or step functions. Here again, the indications 8g and 8g×sin $\alpha_B$ result from the imaging ratio of 8:1 used in the creation of the blazed grating structures according to the mask projection technique.

There are a large number of possible variations in the production of suitable masks that may by created by means of fs or $F_2$ laser installations. The selected masks are placed together with suitable diaphragms in a changer device for producing the blazed grating structures in the first laser installation L1, i.e. for an excimer laser 1 according to the mask projection technique. The diaphragms can be produced according to the same production technique as the masks. As substrates for masks or diaphragms, quartz glass ($SiO_2$), sapphire ($Al_2O_3$), calcium fluoride ($CaF_2$), or magnesium fluoride ($MgF_2$) may be used.

The femtosecond laser can be used to produce ripples that are arranged in a grating structure and allow to create spectral colors that can be mixed. For the adjustable creation of different ripple spacings which produce the desired grating constant for the creation of the respective spectral color, the plane of the substrate is inclined by a determined angle relative to the laser beam during the creation of the ripples.

Since, as already mentioned, the eye is still just able to resolve an area of 200 µm×200 µm, the maximum side length of a square color pixel must be smaller than 200 µm divided by three=66.67 µm. Then, to produce a mixed color, a subarea of 200 µm×200 µm contains at least 9 square color pixels for the primary colors red, green, and blue, each color pixel by definition containing a single spectral color as the primary color. Thus, for a color pixel side length of 33.33 µm, a subarea 81 according to FIG. 8 contains a total of 36 square color pixels 82, 83, 84 for the primary colors red, green, and blue.

These orders of magnitude enable a new class of authentication features where in a particular subarea e.g. one or only a few color pixels of a different color are interspersed that are not visible to the eye but detectable by an adapted spectrometer.

Figure 8:
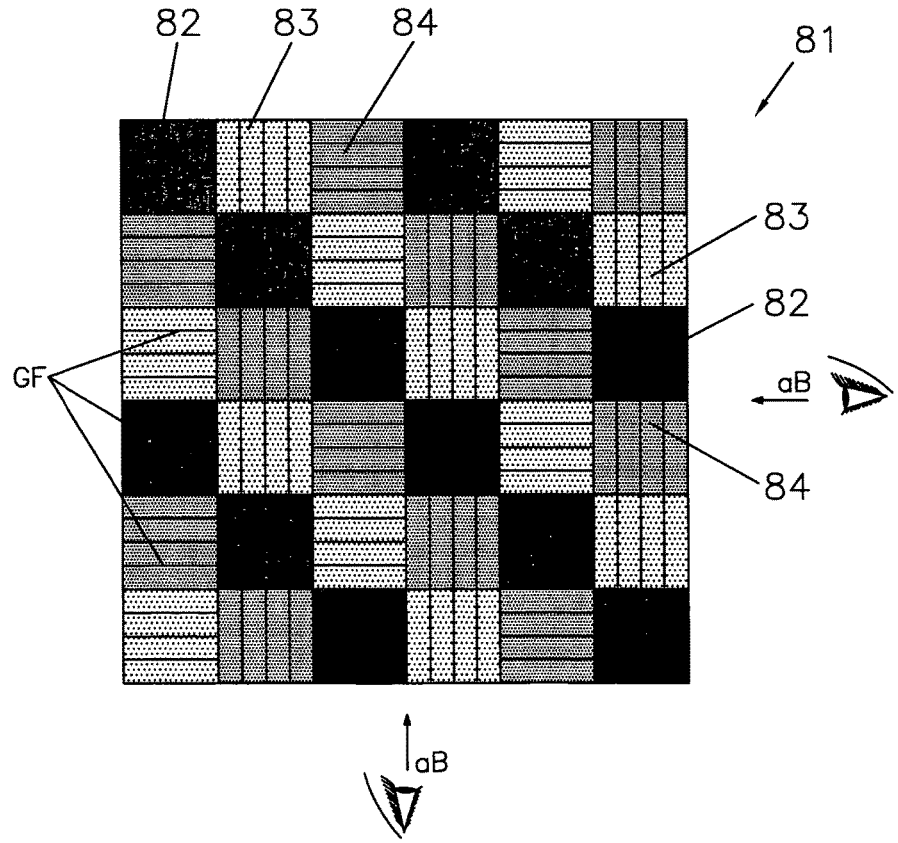
FIG. 8 shows a subarea that is no longer resolvable for the human eye and is formed of a plurality of different color pixel areas.

Herebelow, an exemplary calculation for a grating structure according to subarea 81 of FIG. 8 is indicated. For a side length of a square color pixel of 33.33 µm, perpendicular light incidence, and a diffraction angle=viewing angle $\alpha_m$ for red, green, and blue of 30° with the calculated values for the grating periods of $g_{red}$=1.26 µm, $g_{green}$=1.06 µm, $g_{blue}$=0.86 µm, the red pixel square contains 29 grating periods, the green pixel square 38 grating periods, and the blue pixel square 47 grating periods.

The diffraction intensity of a color pixel is a function of the number of grating periods, i.e. of the total grating furrow length within the color pixel, and of the wavelength of the primary color. Intensity control can only be achieved via the size of the surface area or the number of individual primary color pixels, respectively. In this regard, different factors such as the light source have to be taken into account, i.e. e.g. sunlight during the day, in the morning or in the evening, daylight fluorescent lamp, light bulb or the like, which have different intensity characteristics over the emitted wavelength range and thus influence the intensity of each spectral color. Furthermore, the human eye, i.e. the photopic spectral sensitivity of the human eye to the selected wavelengths of the primary colors has to be taken into account.

According to calculations based on the DIN 5033 standard color chart, the color white is e.g. obtained from the aforementioned spectral colors red, green, and blue produced by grating diffraction in a viewing direction with the following pixel layout when a subarea of 200 µm×200 µm made up of 36 color pixels having a pixel surface area of 33.33 µm×33.33 µm each is composed of: 14 red color pixels 82, 10 green color pixels 83, and 12 blue color pixels 84. According to the same calculations, the color pink is obtained with the following pixel layout: 22 red pixels 82, 3 green pixels 83, and 11 blue pixels 84. Based on the same calculation, skin color is obtained with the following pixel layout: 21 red pixels 82, 7 green pixels 83, and 8 blue pixels 84.

The reference to the resolving ability of the human eye does not mean that the produced spectral and mixed colors are not machine-readable and -analysable as well. Especially in the case of authentication features, which should generally be as small as possible, machine reading is particularly appropriate.

For a predetermined angle of incidence of the light, the grating period and the orientation of the diffraction grating within the color pixel area determine the diffraction directions of the spectral colors and thus the viewing angle and the azimuthal viewing direction of the primary color of the individual pixel. In this regard, the different grating periods for the individual wavelengths of the mixed color have to be chosen and the diffraction gratings of the arrays aligned such that the diffraction angle and the diffraction direction of at least one diffraction order are the same for each wavelength of the mixed color in order to achieve an effective color mixture under at least one viewing angle in at least one azimuthal viewing direction.

According to FIG. 3, in blazed grating 77, $\alpha_B$ is the angle of inclination of the diffracting grating furrows (blaze angle) and diffraction angle $\alpha_m$ is the angle between grating normal GN and the diffraction direction of the intensity maximum of the diffracted monochromatic beam portion gs of the respective diffraction order z and hence indicates the viewing angle $\alpha_m$ and the viewing direction gS for this beam portion at a predetermined angle of incidence $\alpha_e$.

Figure 7:
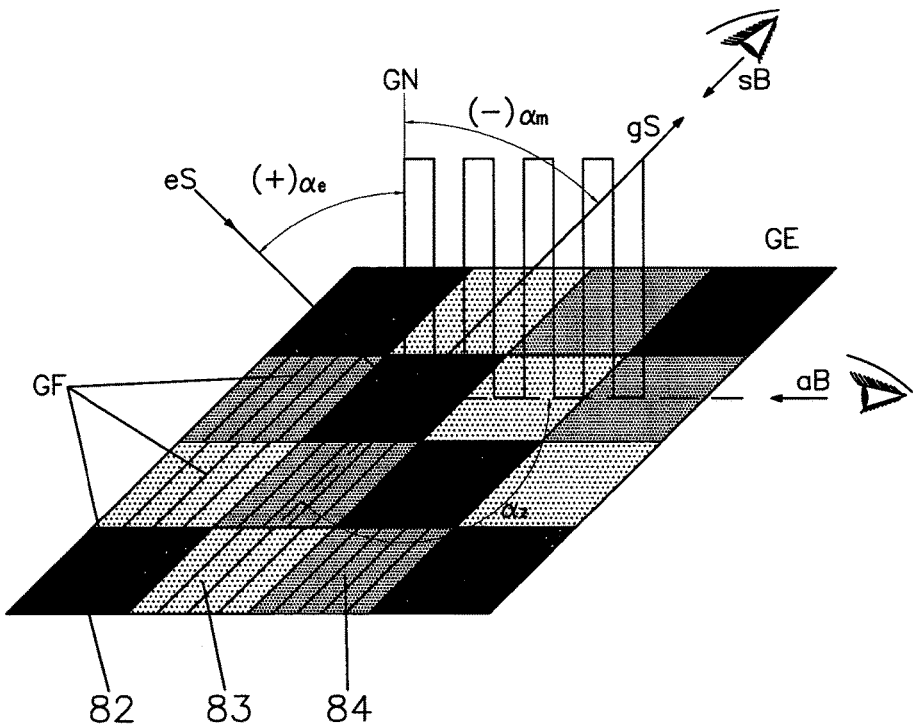
FIG. 7 shows a diffraction grating array with the associated color pixels.

Diffraction angle $\alpha_m$ is determined by the wavelength of the incident light, by the angle of incidence $\alpha_e$, and by grating period g. The term "azimuthal viewing direction" aB of the diffracted monochromatic beam portion refers to the direction, originating from grating normal GN, of the intersecting line of the plane spanned by the grating normal and by diffraction direction gS with grating plane GE, which is characterised by azimuth angle $\alpha_z$, see also FIG. 7. In FIG. 7, sB denotes the viewing direction of the diffracted beam.

Thus, the viewing angle for the mixed color is furthermore dependent upon the matched grating periods of the different color pixel types, and the viewing direction is determined by the orientation of the grating structures, i.e. of grating furrows GF in the different color pixel areas required for creating the mixed color. The creation of a mixed color has to be achieved within a subarea that is no longer resolvable for the human eye of at most 200 µm×200 µm that is formed by a sufficient number of different color pixel areas.

Multiple viewing directions can be realised if grating furrows GF within the color pixels have multiple azimuthal orientations: If e.g. the grating structures in one half of the pixels of a primary color contained in a subarea are arranged perpendicularly to the grating structures in the other half of the pixels, there are also two azimuthal viewing directions aB perpendicular to one another, especially upon irradiation of the grating with diffuse white light, see FIG. 8. To this end, however, half of the total number of color pixels within the subarea must be sufficient for producing the mixed color. In this case, however, the mixed color will be perceived with a reduced intensity in each of the two azimuthal viewing directions.

Also, in this manner, three azimuthal viewing directions that are offset 120° from each other can be realised. According to FIG. 6, with the aid of a column grid grating 80, i.e. by columns P in the form of elevations or complementary pits of different cross-sectional shapes, e.g. circular, triangular, rectangular, hexagonal, and different dimensions, multiple azimuthal viewing directions can be realized. For example, a triangular column or pit cross-section results in three azimuthal viewing directions aB that are offset by $\frac{2}{3}\pi=120°$.

If different pixel sizes for the primary colors are chosen, the side lengths of the larger pixels have to be an integer multiple of the side length of the smallest pixel so that the subarea can be completely filled with color pixels in order to achieve the maximally possible mixed color intensity. A reduction of the intensity, i.e. a darkening effect, can be achieved by inserting pixel areas into the subarea that are e.g. unstructured in the case of ta-C layer substrates or have grating structures which absorb light wavelengths or diffract in a different direction.

To control the intensity of the primary colors for the creation of the mixed colors, besides the number and the surface area of the color pixels and the choice of the diffraction order of the pixels in the viewing direction, different diffraction grating types in the pixels of the primary colors of a subarea can be utilised since e.g. blazed gratings produce higher intensities than groove and rib gratings.

According to the invention, the diffraction grating arrays are applied to surfaces of solid bodies such as metals, metallic alloys, glasses, synthetic materials having hard surfaces, as well as ta-C layers or other hard materials such as hard metals, carbides such as tungsten carbide or boron carbide. More specifically, diffraction grating arrays can be applied to wear-resistant hard materials, e.g. to embossing tools for embossing authentication features, color patterns, or signs having a color effect on packaging foils, while it is apparent that the negative of the diffraction grating structures on the embossing tool has to be designed with such a cross-sectional geometry and such dimensions of the microstructures that based on the properties of the material that is to be embossed and the embossing parameters, the embossed positive represents the optimum diffraction grating pattern for the intended diffraction-optical effect.

The first laser installation L1 with a changer device for diaphragms and masks that allows placing any desired mask and any desired diaphragm into the beam path of the excimer laser enables a large variety not only of different grating structures having different grating constants, but also a large number of possible designs of the outer contour of the grating structure areas. Thus it is possible to design the shape of the structured area elements that are composed of a plurality of subareas as squares, rectangles, triangles, parallelograms, hexagons, etc., or possibly as circles, the most diverse grating structures for creating colors and mixed colors being possible in these area elements. In certain dispositions it is also possible e.g. to create three-dimensionally appearing cube patterns composed of three parallelograms or stars having multiple rays.

Furthermore, the two laser installations allow to superpose the most diverse grating structures, e.g. first to produce a particular grating structure and area elements arranged in a pattern by means of the excimer laser, onto which ripple grating structures are applied by means of the femtosecond laser in order to create another combination of colors and mixed colors that may particularly also be used as authentication features. Also, different viewing angles can be realised, or stepwise or continuous color changes, or the appearance and disappearance of color patterns or color images upon inclination or rotation of the diffraction grating pattern by a stepwise variation of the grating periods or of the orientation of the grating furrows.

The invention claimed is:

1. A method for producing a mask and/or a diaphragm via a first laser installation and for creating microstructures on a solid body surface of an embossing tool via a second laser installation, the method comprising:

roughening and modifying areas of the mask and/or the diaphragm via the first laser installation by altering a material density, structure and refractive index of the mask and/or the diaphragm by irradiation with a suitable fluence of a femtosecond or picosecond laser beam, the areas being opaque to an incident laser radiation of the second laser installation; and providing the incident laser radiation through the mask and/or diaphragm via the second laser installation to scatter the incident laser radiation from the mask and/or diaphragm onto the solid body surface to create microstructures on the solid body surface of the embossing tool.

2. The method according to claim 1, wherein the mask and/or the diaphragm consists of a quartz glass, sapphire, calcium fluoride, or magnesium fluoride substrate.

3. The method according to claim 1, wherein the suitable fluence is of the femtosecond laser beam and the femtosecond laser beam has a centre wavelength of 775 nm or a frequency-doubled or frequency tripled wavelength.

4. The method according to claim 1, wherein the areas include at least one of a number of transparent triangles or a number of stripes of stepwise transparency.

5. The method according to claim 1,
wherein at least one mask and at least one diaphragm are arranged in a rotational and changer device and the at least one mask is located in a homogenous spot of a mask projection unit of an excimer laser installation and serves for the creation of blazed gratings.

6. The method according to claim 5, wherein the blazed gratings are arranged in diffraction grating arrays, wherein grating periods of the blazed gratings range from 0.5 µm to 5 µm, and wherein the blazed gratings are linear or circular.

7. The method according to claim 5, wherein a diffraction grating array is composed of subareas whose longitudinal dimension has a value below a resolving ability of a human eye and which contain at least one pixel, the at least one pixel being a limited diffraction grating structure for producing a single spectral color that is diffracted by chosen grating parameters and an angle of incidence in determined diffraction angles in at least one determined azimuthal viewing angle.

8. The method according to claim 7, wherein each of the subareas contains at least two pixels each having a different grating constant for producing two different spectral colors in a same diffraction angle in a same azimuthal viewing angle.

9. The method according to claim 8, wherein at least one of a pixel area and a number of pixels are chosen such that different spectral colors superimpose in at least one predetermined viewing direction to produce a mixed color.

10. The method according to claim 8, wherein wavelengths for primary spectral colors red, green, and blue are selected according to an intended application, and that if a mixed color is to be viewed by a human eye, three colors are red, green, and blue with a wavelength λred of 630 nm, λgreen of 530 nm, and λblue of 430 nm.

11. The method according to claim 7, wherein the subareas have a maximum longitudinal dimension of 200 μm and the associated pixel areas a maximum longitudinal dimension of 66.67 μm.

12. The method according to claim 7, wherein the subareas are applied to the solid body surface and juxtaposed to form signs, images, logos, or authentication features.

13. The method according to claim 12, wherein the solid body surface is a hard material coated surface of an embossing roller or of an embossing die for embossing packaging foils, the hard material coated surface including ta-C, tungsten carbide, boron carbide, silicon carbide or similar hard materials.

14. A device for implementing the method according to claim 1, comprising:
a first laser installation of the at least one laser installation for producing blazed gratings, groove and rib gratings or column grid gratings comprising a KrF excimer laser having a wavelength of 248 nm, an ArF excimer laser having a wavelength of 193 nm, or a XeCl excimer laser having a wavelength of 308 nm; and
a second laser installation of the at least one laser installation for producing ripple structures comprising a femtosecond laser having a centre wavelength of 775 nm or its frequency-doubled or tripled wavelength, or a picosecond laser of the Nd:YAG type having a wavelength of 1064 nm or its frequency-doubled or tripled wavelength.

15. The device according to claim 14, wherein at least one mask and diaphragm combination are between the excimer laser and imaging optics of the excimer laser, a number of mask and diaphragm combinations being arranged in a rotational and changer device and the changer device being adapted to place two masks and one diaphragm in a beam path of the excimer laser independently of each other, the masks and diaphragms being arranged in holders while being displaceable linearly or rotatively and rotatable about themselves.

16. The device according to claim 15, wherein each of the masks is a triangular mask or a stripe mask for producing blazed gratings.

17. The device according to claim 14, the device configured to structure areas on an embossing roller or an embossing die for embossing diffraction-optically effective areas on a packaging foil.

18. The device according to claim 14, the device configured to produce diffraction-optically effective signs or authentication features on portions of coated or uncoated watch parts, watchglasses from glass or sapphire, coins, or decorative objects.

19. A packaging foil having been embossed with the rollers or embossing dies structured according to claim 17, wherein the packaging foil has diffraction-optically effective areas and/or authentication features comprising color pixels of a spectral color or color pixels of different colors for creating mixed colors.

20. The packaging foil according to claim 19, wherein the packaging foil is satinized in those locations where there are no diffraction-optically effective areas, authentication features, and/or logos.

21. A method for producing at least one of a mask and a diaphragm, and using the at least one of the mask and the diaphragm for irradiation by a laser beam that creates microstructures on a solid body surface of an embossing tool, the method comprising:
providing a transparent substrate;
modifying areas of the transparent substrate with a fluence of a femtosecond or picosecond laser beam to form modified areas in the transparent substrate that scatter the laser beam for the irradiation, by altering a material density, structure, and refractive index of the transparent substrate; and
irradiating the solid body surface of the embossing tool via the laser beam by passing the laser beam through areas of the at least one of the mask and the diaphragm onto the solid body surface to form the microstructures on the solid body surface of the embossing tool.

22. The method according to claim 21, wherein the modified areas are blazed grating structures.

23. The method according to claim 21, wherein the modified areas do not absorb the laser beam from the step of irradiating.

24. The method according to claim 21, wherein the step of modifying further comprises:
roughening a laser incident surface of the transparent substrate with overlapping and focused laser pulses of the fluence of the femtosecond or the picosecond laser beam.

25. The method according to claim 1, wherein the microstructures on the solid body surface are optical diffraction gratings.

26. The method according to claim 25, wherein the optical diffraction gratings are arranged in diffraction grating arrays, and grating periods of the diffraction grating arrays range from 0.5 μm to 5 μm.

27. The method according to claim 26, wherein each of the diffraction grating arrays include subareas whose longitudinal dimension have a value below a resolving ability of a human eye and which include pixels, the pixels being a limited diffraction grating structure for producing a single spectral color that is diffracted by grating parameters and an angle of incidence in determined diffraction angles in at least one determined azimuthal viewing angle.

28. The method according to claim 1, wherein in the step of irradiating, optics are used that provide for an imaging scale between the areas of the mask and/or diaphragm and the microstructures of the solid body surface of 8:1.

29. The method according to claim 21, wherein the microstructures on the solid body surface are optical diffraction gratings.

30. The method according to claim 29, wherein the optical diffraction gratings are arranged in diffraction grating arrays, and grating periods of the diffraction grating arrays range from 0.5 μm to 5 μm.

31. The method according to claim 30, wherein each of the diffraction grating arrays include subareas whose longitudinal dimension have a value below a resolving ability of a human eye and which include pixels, the pixels being a limited diffraction grating structure for producing a single spectral color that is diffracted by grating parameters and an angle of incidence in determined diffraction angles in at least one determined azimuthal viewing angle.

32. The method according to claim 21, wherein in the step of irradiating, optics are used that provide for an imaging scale between the areas of the mask and/or diaphragm and the microstructures of the solid body surface of 8:1.

33. The method according to claim 1, wherein the solid body surface includes at least one of tetrahedrally bonded amorphous carbon (ta-C), tungsten carbide (WC), boron carbide ($B_4C$), or silicon carbide (SiC), and
wherein the microstructures form embossing structures in the solid body surface.

34. The method according to claim 1, wherein the step of providing the incident laser radiation further includes rotating the mask and/or diaphragm about an optical axis of the second laser installation by a predetermined angle to change an orientation of a laser beam intensity profile shaped by the mask and/or diaphragm and imaged on the solid body surface.

35. The method according to claim 21, wherein the solid body surface includes at least one of tetrahedrally bonded amorphous carbon (ta-C), tungsten carbide (WC), boron carbide ($B_4C$), or silicon carbide (SiC), and
wherein the microstructures form embossing structures in the solid body surface.

36. The method according to claim 21, wherein the step of irradiating further includes rotating the mask and/or diaphragm about an optical axis of the laser beam by a predetermined angle to change an orientation of a laser beam intensity profile shaped by the at least one of mask and diaphragm imaged on the solid body surface.

* * * * *